(12) United States Patent
Myers et al.

(10) Patent No.: US 9,363,905 B2
(45) Date of Patent: Jun. 7, 2016

(54) COSMETIC CO-REMOVAL OF MATERIAL FOR ELECTRONIC DEVICE SURFACES

(75) Inventors: Scott Myers, San Francisco, CA (US);
Richard Heley, Palo Alto, CA (US);
Matthew Theobald, San Francisco, CA (US); Adam Stagnaro, Santa Cruz, CA (US); Tang Tan, Palo Alto, CA (US);
Richard Dinh, San Jose, CA (US);
David Pakula, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 184 days.

(21) Appl. No.: 12/794,496

(22) Filed: Jun. 4, 2010

(65) Prior Publication Data

US 2011/0186325 A1 Aug. 4, 2011

Related U.S. Application Data

(60) Provisional application No. 61/300,780, filed on Feb. 2, 2010, provisional application No. 61/325,625, filed on Apr. 19, 2010, provisional application No. 61/325,786, filed on Apr. 19, 2010.

(51) Int. Cl.
*H05K 5/02* (2006.01)
*H05K 13/00* (2006.01)
*G06F 1/16* (2006.01)
*H05K 5/03* (2006.01)
*H04M 1/02* (2006.01)

(52) U.S. Cl.
CPC .............. *H05K 5/02* (2013.01); *G06F 1/1626* (2013.01); *G06F 1/1656* (2013.01); *H05K 5/03* (2013.01); *H04M 1/0249* (2013.01); *Y10T 29/49002* (2015.01); *Y10T 29/49169* (2015.01)

(58) Field of Classification Search
USPC ............ 428/44, 45; 63/3.1, 3.2, 9, 15.1–15.4, 63/15.65, 15.7
See application file for complete search history.

(56) References Cited

U.S. PATENT DOCUMENTS

| | | | | |
|---|---|---|---|---|
| 449,739 A * | 4/1891 | Hazelton | ........................ | 404/41 |
| 1,158,051 A * | 10/1915 | Hopkinson | ..................... | 428/44 |
| 2,714,269 A * | 8/1955 | Stafford | ............................ | 59/80 |
| 3,066,501 A * | 12/1962 | Stafford et al. | .................... | 63/39 |
| 3,192,738 A * | 7/1965 | Stafford et al. | .................... | 63/39 |
| 3,263,444 A * | 8/1966 | Di Croce | ....................... | 63/15.7 |
| 3,460,282 A * | 8/1969 | Swirsky | ......................... | 40/530 |
| 4,037,978 A * | 7/1977 | Connelly | ...................... | 403/164 |
| 4,253,268 A * | 3/1981 | Mayr | ............................ | 446/104 |

(Continued)

FOREIGN PATENT DOCUMENTS

| CN | 2114534 | 9/1992 |
|---|---|---|
| CN | 1695889 | 11/2005 |

(Continued)

*Primary Examiner* — David Sample
(74) *Attorney, Agent, or Firm* — Brownstein Hyatt Farber Schreck, LLP

(57) ABSTRACT

This is directed to providing a cosmetic finish on a component constructed by connecting several elements. A single manufacturing process, such as machining or grinding, can be applied to the connected elements to remove material from some or all of the elements and to form a smooth and continuous surface across interfaces between the individual elements of the component. In some cases, settings of the material removal process can be adjusted based on the material of the component elements. For example, the settings can be adjusted based on the manufacturing or mechanical properties of each element material.

15 Claims, 5 Drawing Sheets

(56) References Cited

U.S. PATENT DOCUMENTS

| | | | |
|---|---|---|---|
| 4,474,504 A * | 10/1984 | Whitman et al. | 405/16 |
| 4,935,995 A * | 6/1990 | Daus, Jr. | 24/580.1 |
| 5,080,523 A * | 1/1992 | Steiner | 404/7 |
| 5,187,843 A * | 2/1993 | Lynch | 24/587.12 |
| 5,348,778 A * | 9/1994 | Knipp et al. | 428/35.8 |
| 5,412,956 A * | 5/1995 | Levy | 63/15.65 |
| 5,791,810 A * | 8/1998 | Williams | 403/364 |
| 6,023,946 A * | 2/2000 | Magi | 63/9 |
| 6,349,453 B1 * | 2/2002 | Nicoletti et al. | 24/616 |
| 6,503,766 B1 | 1/2003 | Ni | |
| 6,949,005 B1 | 9/2005 | Larsen et al. | |
| 7,013,674 B2 * | 3/2006 | Kretchmer | 63/5.1 |
| 7,134,198 B2 | 11/2006 | Nakatani et al. | |
| 7,198,549 B2 * | 4/2007 | Steckenrider et al. | 451/36 |
| 7,306,469 B1 * | 12/2007 | Slautterback | 439/86 |
| 7,332,231 B2 | 2/2008 | Ichiyanagi et al. | |
| 7,353,665 B2 * | 4/2008 | Richardson | 63/38 |
| 7,354,330 B2 * | 4/2008 | Bentley, Jr. | 446/102 |
| 7,435,031 B2 * | 10/2008 | Granata | 403/74 |
| 7,482,983 B2 | 1/2009 | Chang et al. | |
| 7,539,008 B2 * | 5/2009 | Chang et al. | 361/679.4 |
| 7,545,590 B2 * | 6/2009 | Chang | 359/826 |
| 7,612,997 B1 | 11/2009 | Diebel et al. | |
| 7,724,532 B2 | 5/2010 | Zadesky et al. | |
| 8,023,260 B2 * | 9/2011 | Filson et al. | 361/679.55 |
| 8,028,794 B1 * | 10/2011 | Freeman | 181/202 |
| 8,204,561 B2 * | 6/2012 | Mongan et al. | 455/575.8 |
| 8,270,914 B2 * | 9/2012 | Pascolini et al. | 455/90.2 |
| 2002/0069670 A1 * | 6/2002 | Rosenberg | 63/15.7 |
| 2007/0057853 A1 * | 3/2007 | Chang et al. | 343/702 |
| 2009/0035589 A1 * | 2/2009 | Lee | 428/457 |
| 2009/0096446 A1 | 4/2009 | Takahashi et al. | |
| 2009/0126480 A1 | 5/2009 | Kuhny et al. | |
| 2010/0048257 A1 | 2/2010 | Prest et al. | |
| 2010/0124040 A1 * | 5/2010 | Diebel et al. | 361/816 |
| 2011/0133995 A1 * | 6/2011 | Pascolini et al. | 343/702 |
| 2011/0136447 A1 * | 6/2011 | Pascolini et al. | 455/90.2 |

FOREIGN PATENT DOCUMENTS

| | | |
|---|---|---|
| CN | 2862487 | 1/2007 |
| CN | 101364663 | 2/2009 |
| CN | 101578015 | 11/2009 |
| CN | 101601335 | 12/2009 |
| EP | 2117074 | 11/2011 |
| FR | 2903630 | 1/2008 |
| FR | 2903630 B1 | 10/2008 |
| GB | 1319088 | 5/1973 |
| JP | H05-084833 | 4/1993 |
| JP | 07-001143 | 1/1995 |
| JP | 2003158415 | 5/2003 |
| JP | 2005-262363 A | 9/2005 |
| JP | 2005262363 | 9/2005 |
| JP | 2006278469 | 10/2006 |
| TW | I304320 | 12/2008 |
| TW | 200906610 | 2/2009 |
| WO | 2009126480 A2 | 10/2009 |
| WO | 2010/050834 | 5/2010 |

* cited by examiner

COSMETIC CO-REMOVAL OF MATERIAL FOR ELECTRONIC DEVICE SURFACES

CROSS-REFERENCE TO RELATED APPLICATION

This application claims the benefit of U.S. Provisional Patent Application No. 61/300,780, filed Feb. 2, 2010; U.S. Provisional Patent Application No. 61/325,625, filed Apr. 19, 2010; and U.S. Provisional Patent Application No. 61/325,786, filed Apr. 19, 2010, all of which are incorporated by reference herein in their entireties.

BACKGROUND

A portable electronic device can be constructed using different approaches. In some cases, an electronic device can be constructed by assembling several components together. The components can include external components combining to form a device enclosure, as well as internal components providing different functionality to the device. For example, an electronic device enclosure can include an integral component, or a component constructed from a single material (e.g., a housing member). Such a component can provide substantial structural integrity, as there may be no seams or gaps limiting the resistance of the component to applied external forces.

In some cases, a component of an electronic device can be used as part of an electrical circuit. For example, a component can provide electrical functionality to another component of a device (e.g., serve as a resistor or as a capacitor for a processor). As another example, a component can be part of an antenna assembly of an electronic device. If the component is used in only a single electrical circuit, the component can be constructed from a single piece of conductive material. If the same component, however, is used in several different electrical circuits, the component may need to be constructed from several conductive elements separated by a non-conductive or insulating element. For example, first and second conductive elements can be connected together by an insulating intermediate element.

The insulating element can be connected to conductive elements of a component using any suitable approach. In some embodiments, the insulating element can extend beyond an interface between the insulating element and a conductive element as a result of the manufacturing process used to connect the conductive elements together using the insulating element. For example, a molded insulating element can include excess material that seeped through a seam of a mold. When the multi-element component is part of the electronic device enclosure, the excess material can adversely affect a user's enjoyment of the device. For example, the excess material can catch on a user's hand or clothing. As another example, the excess material can increase a user's odds of dropping and breaking the electronic device. As still another example, the excess material can adversely affect the aesthetic appearance of the device.

SUMMARY

This is directed to simultaneously processing several different materials forming a single surface of an electronic device component to define a continuous component surface extending over an interface or seam between the different materials. In particular, this is directed to providing a component constructed by combining several elements, and removing material from at least two of the several elements to provide a continuous and cosmetically pleasing surface across interfaces between the elements. The several elements can be formed from at least two different materials having different material properties.

An electronic device component can be constructed by connecting two elements together using an intermediate element formed from a material other than that used for at least one of the two elements. For example, the two elements can be constructed from a conductive material (e.g., metal), while the intermediate element can be constructed from an insulating material (e.g., plastic). The materials used can have different properties including, for example, different mechanical, manufacturing, electrical, and thermal properties (e.g., materials having different manufacturing or mechanical hardness). The different properties of the materials can require different processes for cutting or removing portions of the materials including, for example, different tools, different settings for a single tool, or different manufacturing processes (e.g., different machines).

To create an aesthetically pleasing component, and in particular to remove excess material from one or more of the elements to provide a continuous surface across an interface between adjacent elements of the component, one or more finishing processes can be applied to the connected elements. In some cases, a single tool or process can be used to finish a surface that includes several elements constructed from different materials. For example, a single tool can be used for an entire component. As another example, a tool can be used for each of several different surfaces of a component (e.g., surfaces on different planes). Because of the different material properties of the elements, however, the manner in which the process or tool is applied (e.g., rotation speed, or application force) can vary based on the element being processed. In some cases, the process can dynamically adjust settings based on the particular element being processed. In other cases, the process can apply settings that correspond to a softer of several materials.

Any suitable type of finishing process can be applied to a component. For example, a process can remove excess material, smooth out bumps, fill valleys or holes, or perform any other operation required to provide a continuous and uniform surface across an interfaces between elements connected together in the component. Such a process can include, for example, a polishing or grinding operation. By processing the component post-assembly (e.g., once individual elements have been connected together), the resulting component may have continuous external surfaces and even appear to be formed from a unitary piece of material, despite being the combination of several elements. By processing the component using a single tool or a single step, the manufacturing process for the component can be shortened.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can include several components assembled together to form internal and external features of the device. For example, one or more internal components (e.g., electrical circuitry) can be placed within external components (e.g., a housing) to provide a device having desired functionality. Different components can be manufactured using several approaches including, for example, by assembling and connecting individual elements together. In some cases, an external housing component can be constructed by assembling several elements together to form an integral component.

Figure 1:
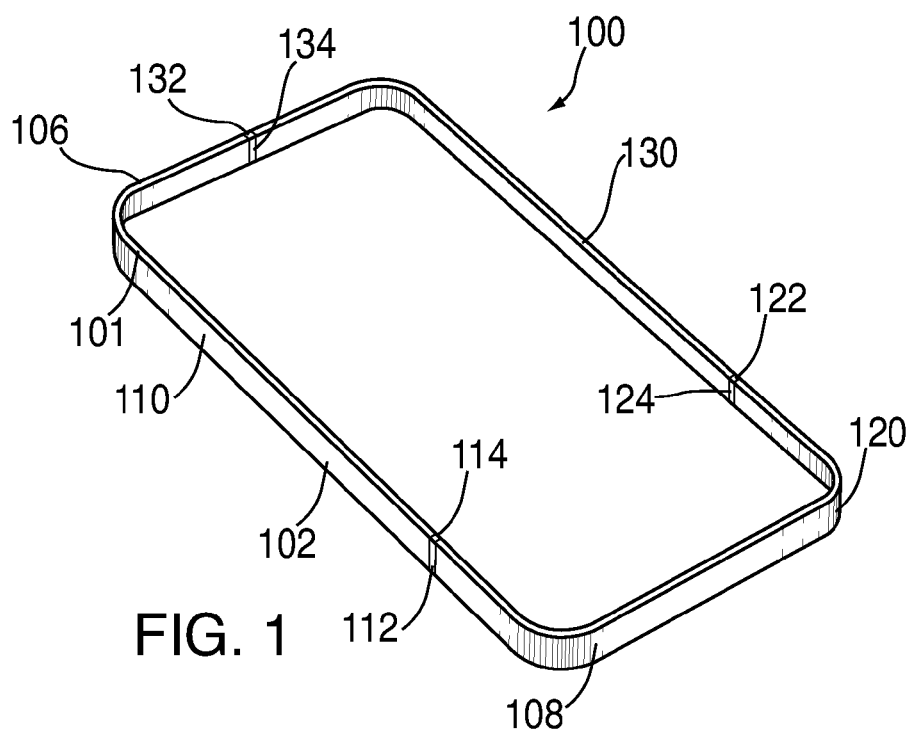
FIG. 1 is a schematic view of an illustrative outer periphery member constructed by connecting several elements together in accordance with one embodiment of the invention.

FIG. 1 is a schematic view of an illustrative outer periphery member constructed by connecting several elements together in accordance with one embodiment of the invention. Outer periphery member 100 can be constructed to form an exterior surface for an electronic device. In particular, outer periphery member 100 can surround or wrap around some or all of the electronic components such that outer periphery member 100 defines an internal volume into which electronic device components can be placed. For example, outer periphery member 100 can wrap around the device such that external surfaces 101 of outer periphery member 100 define a left surface 102, a right surface 104, as well as a top surface 106 and a bottom surface 108 of the device. To provide a desired functionality to a user, the electronic device can include several components placed within the device, for example within the internal volume of the outer periphery member.

The thickness, length, height, and cross-section of the outer periphery member can be selected based on any suitable criteria including, for example, based on structural requirements (e.g., stiffness, or resistance to bending, compression, tension or torsion in particular orientations). In some embodiments, the outer periphery member can serve as a structural member to which other electronic device components can be mounted. Some of the structural integrity of outer periphery member 100 can come from the closed shape that it defines (e.g., outer periphery member 100 forms a loop).

Outer periphery member 100 can have any suitable cross-section. For example, outer periphery member 100 can have a substantially rectangular cross-section. In some embodiments, outer periphery member 100 can instead or in addition have a cross-section in a different shape including, for example, a circular, oval, polygonal, or curved cross-section. In some embodiments, the shape or size of the cross-section can vary along the length or width of the device (e.g., an hourglass shaped cross-section).

The outer periphery member of an electronic device can be constructed using any suitable process. In some embodiments, outer periphery member 100 can be constructed by connecting element 110 and element 120 together at interface 112, connecting element 120 and element 130 together at interfaces 122, and connecting element 130 and element 110 together at interface 132. The elements can have any suitable shape including, for example, large L-shape element 110, small L-shape element 120, and U-shape element 130. Each element can be constructed individually and later assembled to form outer periphery member 100. For example, each element can be constructed using one or more of stamping, machining, working, casting, or combinations of these. In some embodiments, the materials selected for elements 110, 120 and 130 can be conductive to provide an electrical functionality to the device (e.g., to serve as part of an antenna).

To join the individual elements together, intermediate elements 114, 124 and 134 can be placed within interfaces 112, 122, and 132, respectively. In some embodiments, each of the intermediate elements can be constructed from a material that can initially be provided in a first state in which the material can flow between elements 110 and 120, elements 120 and 130, and elements 130 and 110 when placed in interfaces 112, 122 and 132, respectively. The material can subsequently change to a second state in which the material bonds together elements 110 and 120, 120 and 130, and 130 and 110, respectively, to form a single new component (e.g., an integral component).

Different approaches can be used to connect individual component elements together. For example, a mechanical fastener, connector or other connector piece can be coupled to several component elements that are assembled together. A connector piece can have any suitable size relative to the elements being connected. In some cases, one or more portions of the connector piece can extend along a side surface of an element, or otherwise extend beyond a boundary defined by a cross-section of the elements (e.g., when two elements are connected end to end, such as outer periphery member elements, as described above in connection with FIG. 1). In some cases, an adhesive can be used instead of or in addition to a mechanical fastener or connector. For example, an adhesive layer can be placed between the components being connected. The adhesive layer can be provided using any suitable approach including, for example, as a liquid or paste adhesive, tape, heat-based adhesive, or combination of these. In some embodiments, an adhesive layer can have a reduced thickness or width (e.g., reducing the space between the elements) to ensure that the elements are properly connected. This may be due to mechanical properties of the adhesive, as a thicker layer of the adhesive may have limited strength in bending, compression, peeling, tension, or several of these.

Figure 2:
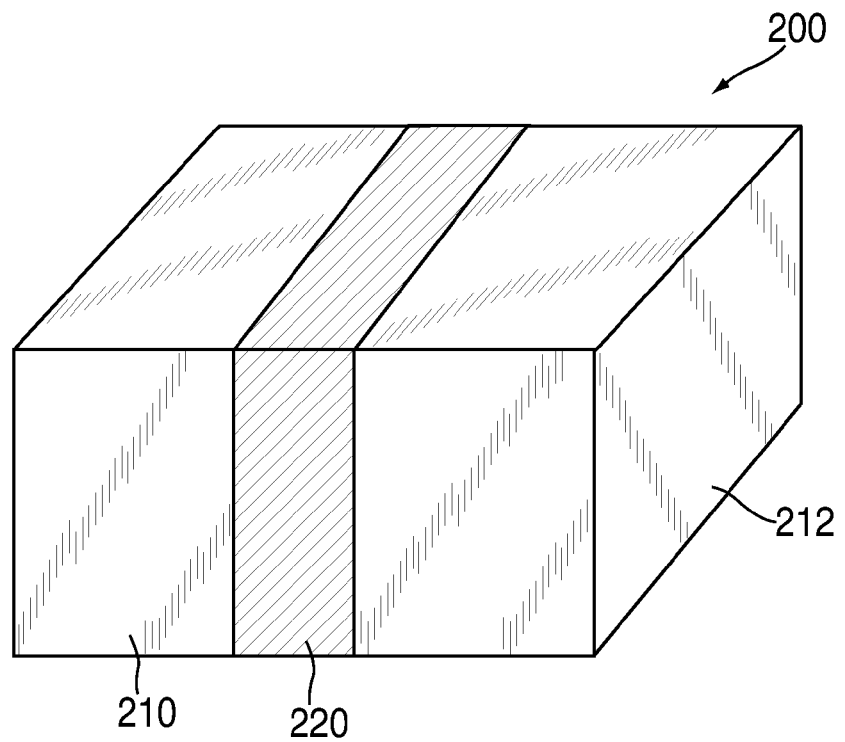
FIG. 2 is a schematic view of an illustrative electronic device component in accordance with one embodiment of the invention.

While these approaches can be effective to couple elements together, they can also require the profile of a component to increase (e.g., beyond the cross-section of the elements being connected) or can limit the width or size of the connector (e.g., only allow a film layer between the elements). In addition, some of these approaches may require that the individual elements be accurately manufactured (e.g., with high tolerances) to ensure that the resulting component is also manufactured within high tolerances. FIG. 2 is a schematic view of an illustrative electronic device component in accordance with one embodiment of the invention. Component 200 can be constructed from first element 210 and second element 212, which can be connected by intermediate element 220.

First and second elements 210 and 212 can be constructed from any suitable materials including, for example, the same or different materials. For example, first and second elements 210 and 212 can be constructed from one or more of a metal, plastic, a composite material, an organic material, or combinations of these. In some cases, one or both of the elements can be constructed from conductive materials (and thus be used as part of circuitry within the device), but may need to be electrically isolated from one another for proper functioning of device circuitry. In such cases, the intermediate element can be constructed from an insulating or dielectric material to prevent an electrical signal from crossing the gap between first element 210 and second element 212. In some embodiments, the connecting element can be constructed from a combination of conductive and insulating materials, where the insulating materials are disposed between the conductive materials. Alternatively, one or more conductive materials can be embedded within insulating materials.

The individual elements of the component can be positioned using any suitable approach. For example, individual elements can be aligned such that cross-sections of each element are aligned with each other (e.g., the elements are non-overlapping). As another example, individual elements can be positioned relative to each other such that the cross-section of the portions of intermediate element 220 at the interfaces with the first and second elements do not extend beyond the cross-sections of the first and second elements at the interfaces.

Intermediate element 220 can have any suitable size. For example, intermediate element 220 can have any suitable length (e.g., defining the distance between first and second elements 210 and 212), including a length that is substantially the same size or larger than a length associated with one or both of first and second elements 210 and 212. Alternatively, the length of intermediate element 220 can be less than a length associated with one or both of first and second elements 210 and 212 (e.g., but at least 0.25 mm, such as 0.5 mm or 1 mm). In some embodiments, the length or shape of intermediate element 220 can be selected based on mechanical properties of the intermediate element material. For example, the intermediate element can include a variable width or cross section in the region between the elements.

In some embodiments, the size or shape of intermediate element 220 can vary between different components. For example, some or all of first and second elements 210 and 212 can be constructed with relatively low tolerance, such that the length of arms or portions of the first and second elements that are placed in contact with the intermediate element can vary. In particular, first and second elements 210 and 212 can be initially manufactured with lower tolerances, and then positioned in a fixture having higher tolerances. Intermediate element 220 can be placed between the first and second elements. The material and process used to connect intermediate element 220 between first and second elements 210 and 212 can be selected such that the material can initially be provided in a first state in which the material can fill the gap or space, or span the interface between the first and second elements. For example, the material can be provided as a liquid or a moldable solid (e.g., a soft clay-like state) such that the material can be shaped into an intermediate element. In some embodiments, the fixture can define boundaries and features (e.g., protrusions or detents) within the intermediate element surfaces.

Once properly positioned between the first and second elements (e.g., filling the gap between the elements), the material of the intermediate element can change to a second state in which the material adheres to both the first and second elements to provide a structurally sound bond (e.g., a mechanical bond) between them (e.g., the intermediate element is integrated between the first and second elements). For example, the material can harden and provide structural integrity between the first and second elements. Because the material can flow into any gap between the first and second elements while in the first state, the material can absorb or erase variations in the manufacturing of the first and second materials due to low manufacturing tolerances of those elements, while ensuring that the resulting component is constructed with higher precision than its individual components.

This approach may in addition reduce the complexity and detail required to construct the first and second elements. In particular, because the material of the intermediate element can flow in the first state, the material can flow around and into features of each of the first and second elements (as described below) to ensure that the material is securely coupled to each of the first and second elements. Furthermore, this approach can be forgiving of imperfections and other manufacturing artifacts along the exposed surface of each of the first and second elements. In fact, the opposing surfaces of the first and second elements may not need to have corresponding features, as the opposing surfaces of the first and second elements may not engage or need to be placed in close proximity (e.g., as would otherwise be required with an adhesive). Instead, the material injected into the mold can flow around the features, and accommodate any offsets or misalignments of the features.

Any suitable process can be used to provide the material of the intermediate element between the first and second elements, and to change the state of the material from the first state to the second state. In some embodiments, a molding process by which a material is initially inserted in a liquid state and which subsequently hardens can be used. For example, one or more of injection molding, compression molding, transfer molding, extrusion molding, blow molding, thermoforming or vacuum forming, or rotomolding processes can be used. Using a molding process, material can flow around first and second elements 210 and 212, and the material can accommodate irregularities and defects of the elements, while subsequently changing state to provide structural integrity and define an integral component with high degrees of tolerance.

In some embodiments, a brazing process can be used instead of or in addition to a molding process. For example, a dielectric composite material can be brazed between the first and second elements. In one implementation, a composite material can be placed in a fixture between the first and second elements to be connected, and the composite material can be heated so that it melts and fills a region between the conductive elements (e.g., is distributed between the conductive elements by capillary action or wetting). For example, the fixture and composite material can be placed in contact with a heated surface causing the composite material to heat and flow. The composite material can be cooled once it has filled the region between the conductive elements, forming a secure bond between the composite material and each of the conductive elements. Any suitable type of brazing can be used including, for example, torch blazing, furnace brazing, braze welding, vacuum brazing, or dip brazing. The filler material can include any suitable composite material, including various particular dielectric or insulating composite materials such as, for example, plastic, rubber, organic composites, non-conductive metal alloys, or combinations of these. Furthermore, the geometry of features along internal surfaces of the conductive elements can be selected and designed to enhance the brazed bond.

The elements connected by the intermediate element can include any suitable feature for improving the adhesion between the elements and the intermediate element. FIGS.

3A-3C are schematic top views of illustrative components that includes an intermediate element in accordance with some embodiment of the invention. The components shown in FIGS. 3A-3C include first and second elements connected together by an intermediate element. The first and second elements can include any suitable feature for improving a bond with the intermediate element. In some embodiments, the elements can include one or more internal features that provide an interlocking interface, or that increase the surface area required for adhering the intermediate element to the first and second elements. For example, an element can include a curved internal feature (e.g., a spherical or cylindrical recess or protrusion) into or around which material from the intermediate element can extend, thus increasing a surface tension based force. As another example, an element can include a feature having one or more openings, holes, hooks or other attributes that can engage a corresponding feature of the intermediate element, once the intermediate element has transitioned to the second state (e.g., a hole in the first element into which a post of the intermediate element can extend). In some embodiments, a feature can include an interlock attribute such as, for example, a recessed edge at or near the interface between a recessed feature or a protruding feature, such that the recessed edge that forms a hook into which material from the intermediate element can flow.

Figure 3A:
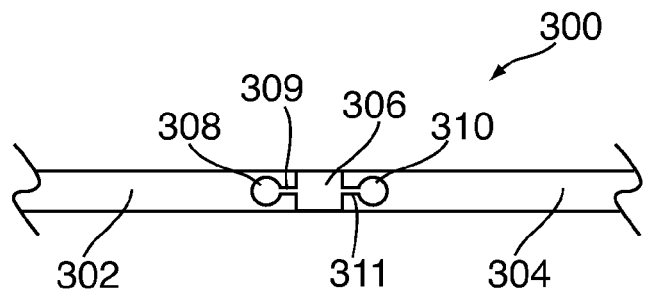
FIGS. 3A-3C are schematic top views of illustrative components that includes an intermediate element in accordance with some embodiments of the invention.

Component 300 shown in FIG. 3A can be constructed by connecting first element 302 and second element 304 using intermediate element 306. To improve the adhesion between first element 302 and intermediate element 306, first element 302 can include opening 308 within the body of the first element that is accessible from the surface of the first element that is in contact with intermediate element 306 by channel 309. Similarly, second element 304 can include opening 310 within the body of second element 304 that is accessible from the surface of the first element that is in contact with intermediate element 306 by channel 311. The opening and channel can have any suitable size or shape including, for example, a shape selected such that the channel is smaller than the opening. This can ensure that material of intermediate element 306 flowing into the opening cannot pass back through the channel, and thus improve the retention of the intermediate member (e.g., the through bore or opening forms an undercut or interlock). The opening can have any suitable shape including for example a curved or angled cross-section, or a variable cross-section. The opening can extend through some, or all, of the first or second element including, for example, through only an internal portion of the element (e.g., to prevent the material of the intermediate element extending in the opening from being exposed at an external surface of the element.

Figure 3B:
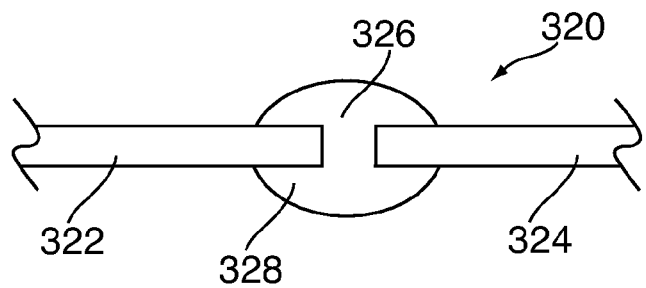

Component 320 shown in FIG. 3B can be constructed by connecting first and second elements 322 and 324 using intermediate element 326. To improve the adhesion of intermediate element 326 to the first and second elements, intermediate element 326 can include overflowing portions 328 extending beyond the cross-section of the first and second elements, which comes into contact with exposed surfaces of the first and second elements (e.g., surfaces other than the interfacing surfaces that oppose one another within the component). Overflowing portions 328 can extend over any suitable surface of the first and second elements including, for example, only over one or more of a top, bottom, front or back surface, and/or along only one of the first and second elements, or various combinations of these.

Figure 3C:
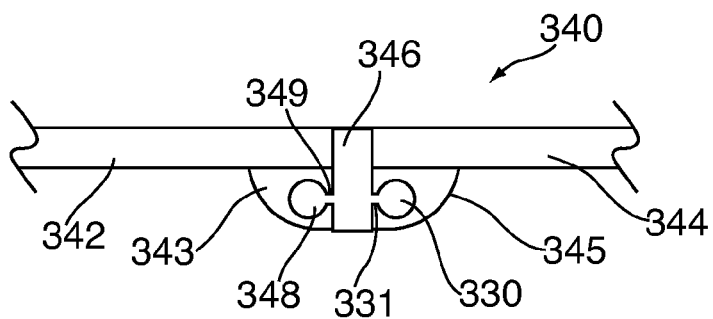

Component 340 shown in FIG. 3C can be constructed by connecting first and second elements 342 and 344 using intermediate element 346. First and second elements 342 and 346 can include openings 348 and 330, and channels 349 and 331, respectively, as described above in connection with component 300. To allow openings 348 and 330 to extend through the entire height of the first and second components, while maintaining uniform and consistent external surfaces of the elements, the first and second elements can include chamfers 343 and 345, respectively, extending from a surface of the elements. For example, the chamfers can extend from an internal surface of the elements, such that the chamfers extend within an internal volume of a device that includes the component. The chamfer can have any suitable height including, for example, a height that matches that of the main body of each element, or a height that is less than that of the main body. In particular, the chamfers can be recessed relative to top and bottom surfaces of the first and second elements. Openings 348 and 330 can extend through the chamfers instead of or in addition to the main bodies of the elements.

Figure 4:
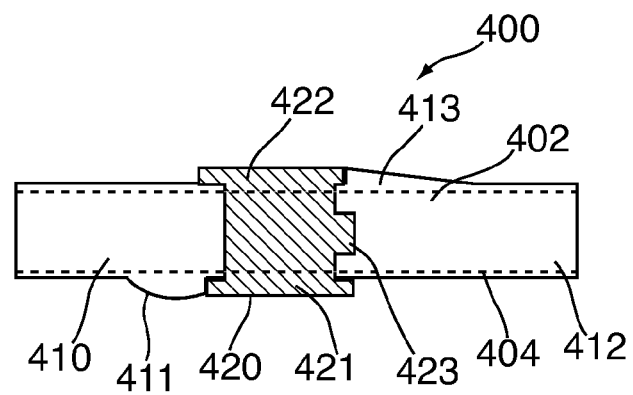
FIG. 4 is a schematic view of an illustrative component constructed from several elements having different material properties in accordance with one embodiment of the invention.

As a result of the manufacturing process, however, the interface between the elements and material used to connect the elements (e.g., the material of the intermediate element) may be discontinuous or include excess material. For example, as material is injected into a mold as part of a molding process, excess material can seep through seams of the mold, and extend beyond boundaries of an interface between the intermediate element and one of the first and second elements. As another example, material can warp or deform as it cools or heats during the connection process (e.g., when the material changes from the first state to the second state). The resulting component can have an uneven interface between the different materials. FIG. 4 is a schematic view of an illustrative component constructed from several elements having different material properties in accordance with one embodiment of the invention. Component 400 can be constructed by connecting first and second elements 410 and 412 using intermediate element 420.

First and second elements 410 and 412, and intermediate element 420 can be constructed from any suitable material including, for example, at least two different materials. For example, first and second elements 410 and 412 can be constructed from a first material, and intermediate element 420 can be constructed from a second material. The materials selected can have different mechanical properties including, for example, different modules of elasticity, tensile strength, compressive strength, shear strength, yield strength, ductility, poisons ration, or combinations of these. In some embodiments, the materials can instead or in addition have different electrical, thermal, chemical, magnetic, optical, acoustical, radiological, or manufacturing properties (e.g., machining speeds and feeds, mauchinability rating, hardness, extruding or molding temperature and pressure, or castability). For example, the first and second elements can be constructed from harder materials (or softer materials), and the intermediate element can be constructed from a softer material (or a harder material). As another example, the first and second elements can be constructed from conductive materials, and the intermediate element can be constructed from an insulating material. As still another example, the first element can be constructed from a thermally conductive material, and the second and intermediate elements can be constructed from thermally insulating materials.

The manufacturing process used to connect first and second elements 410 and 412 using intermediate element 420 can cause excess material to extend beyond desired boundaries or interfaces between the elements (e.g., a boundary in line with external surfaces of first and second elements 410 and 412, such that the regions of intermediate element 420 located in the vicinity of an interface with first element 410 and second element 412 fit within the cross-section of first and second elements 410 and 412, respectively). In particular, a molded intermediate element 420 can include undesirable excess material (e.g., flash) around the interfaces between first element and intermediate element 420, and between second element 412 and intermediate element 420. For example, intermediate element 420 can include excess material 421 and 422 along bottom and top surfaces of the element, and material 423 along a left surface of the element. Excess material can extend beyond the boundaries of one or more surfaces of the component including, for example, around all external surfaces of the component (e.g., around the inner, outer, top and bottom surfaces of an outer periphery member such as the one shown in FIG. 1). Material extending beyond final boundaries 402 and 404 on the top and bottom surfaces of component 400 may be undesirable and need to be removed. To provide a final component that is aesthetically pleasing, the excess material of at least the intermediate element, and in some cases the first and second elements as well, may be removed.

To ensure that the resulting component is aesthetically pleasing, elements 410 and 412 can be finished before being coupled to connecting element 420. For example, elements 410 and 412 can be initially formed to have excess material (e.g., 0.2 mm of excess material) that can be removed to ensure that the elements have smooth or continuous cosmetic surfaces. In some cases, however, the external surfaces of elements 410 and 412 may not be completely finished prior to coupling with the connecting element. Instead, only some excess material can be removed from the surfaces (e.g., most excess material, leaving only 0.05 mm of excess material). The remaining excess material on external surfaces of the elements that may need to be removed to finish the component. In particular, first element 410 can include excess material 411, and second element 412 can include excess material 413. The excess material can take any suitable shape including, for example, seams, tool marks (e.g., from cold work), granular particles, protrusions or bumps, or combinations of these. The excess material can be located on any suitable surface of the elements including, for example, in regions near or away from the interface with the intermediate element.

If first and second elements 410 and 412 are not finished, the combination of first and second elements 410 and 412 with intermediate element 420 can be processed to remove excess material and provide an aesthetically pleasing finish. This approach can limit the number of manufacturing steps required to manufacture the component, as a single finishing step can be used for first element 410, second element 412 and intermediate element 420. Any suitable process can be used to simultaneously finish the elements. For example, a grinding process or other such process can be applied to component 400 to remove excess material from all of the elements, including elements constructed from different materials. Other finishing processes can include, for example, machining, tumbling, etching, electroplating, anodizing, electropolishing, polishing, sandblasting, or combinations of these.

In some embodiments, the manufacturing process for one or more of the first element, second element, and intermediate element can intentionally leave excess material on the component (e.g., as shown in FIG. 4). Using this approach, a single finishing process can be used for the entire component to ensure that the resulting component satisfies industrial design considerations. In particular, the final component (post-finishing process) can have a continuous surface across interfaces or seams between elements of the component.

Although the example of FIG. 4 shows a flat or planar surface between the first and second elements, and the intermediate element, it will be understood that a single process can be used to remove excess material from a surface having any suitable shape. For example, a single process can be applied to a curved surface or a rounded surface. As another example, a single process can be applied to a surface having one or more angled sections (e.g., around corners of a rectangular cross-section).

In some embodiments, a single finishing process can be applied universally to all of the elements (having corresponding different material properties) in a component. For example, a single cutting tool can be applied to all of the elements. As another example, a single grinder can be applied to the surfaces of the component. Alternatively, several tools or grinders can be applied to different surfaces of the component. For example, different tools can be applied to metal and plastic elements to account for differences in mechanical properties of the elements.

In some embodiments, a single process or tool can be used for each of the elements. In some cases, the process or tool can be applied using a setting corresponding to a material property of one of the elements (e.g., the softest material) to prevent smearing or other damage to less resistant materials. Alternatively, a single process or tool can be used with different settings. For example, a different force can be applied to a tool operating on the component. As another example, a grinder can rotate at different speeds, or be pressed against the component with different forces. The finishing process can be adjusted using any suitable approach. In some embodiments, the machining apparatus can include one or more sensors for detecting the type of material that is processed, and can adjust the manner in which the material is processed based on the detected material. Alternatively, an operator can specify the type of material of each element being processed in an assembled component. The apparatus can automatically adjust processing settings, or a user can manually change the settings.

Figure 5:
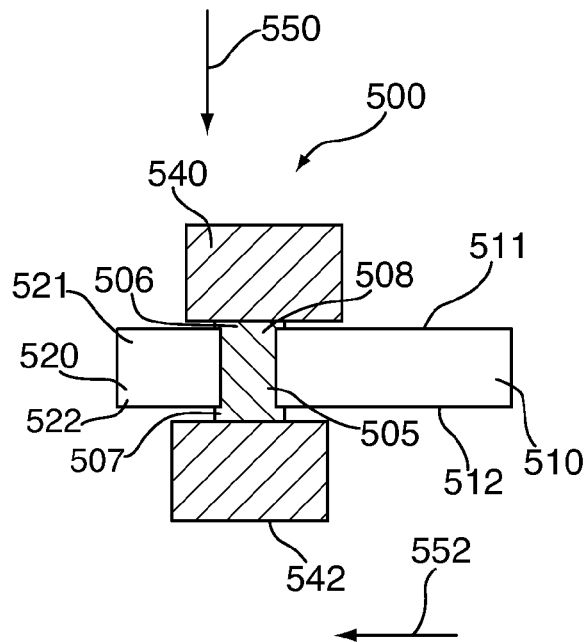
FIG. 5 is a schematic view of an illustrative assembly for removing excess material from front and back surfaces of a component constructed by connecting several elements in accordance with one embodiment of the invention.

FIG. 5 is a schematic view of an illustrative assembly for removing excess material from front and back surfaces of a component constructed by connecting several elements in accordance with one embodiment of the invention. Component 500 can be constructed by connecting first element 510 and second element 520 together using material 505 (which can form an intermediate element). In some embodiments, excess material 505 can extend extending beyond boundaries of gap 508 between first element 510 and second element 520. In particular, excess material 506 can extend beyond front surface 511 of first element 510 and front surface 521 of second element 520, and excess material 507 can extend beyond back surface 512 of first element 510 and back surface 522 of second element 520. The excess material can adversely affect the cosmetic appearance of component 500, and can in some cases in addition or instead affect the structural integrity of the component (e.g., introduce stress points). In some embodiments, the tool used to provide material 505 can prevent excess material from extending past an interface along a particular plane (e.g., prevent excess material 507). In such cases, fewer operations may be required to remove the excess material and provide a cosmetically acceptable component.

To remove excess material 506 and excess material 507, grinding or cutting tools 540 and 542 can be applied to the excess material. For example, cutting tool 540 can be moved towards the front surfaces 511 and 521 (e.g., towards the excess material 506) in direction 550. As another example, cutting tool 540 can substantially rest on one or both of back surfaces 512 and 522, and move laterally along the surface in direction 552 to remove excess material 507 extending beyond the surface level (e.g., remove flash seeping out of a mold seam during a molding process, where the flash constitutes undesired additional material of a molded element). In some embodiments, a single cutting tool can be used successively on the front and back surfaces of elements 510 and 520 (instead of or in addition to using cutting both tools 540 and 542, for example simultaneously).

Figure 6:
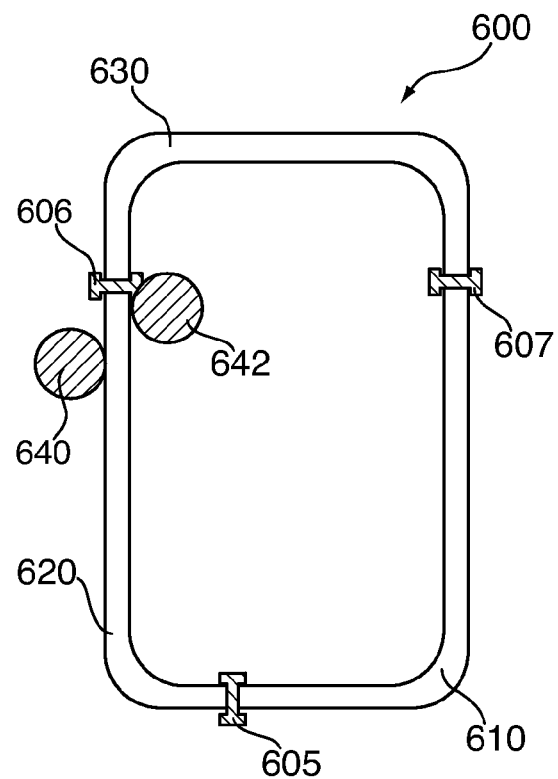
FIG. 6 is a schematic view of an illustrative assembly for removing excess material from a closed ring component in accordance with one embodiment of the invention.

In some embodiments, a grinding, cutting, or other process for removing material can be applied to a component having opposing sidewalls (e.g., forming a loop), such that material can be removed from inner and outer surfaces of the component at the same or different times. In particular, the process can be applied to a ring-like shaped component (e.g., an outer periphery member such as that shown in FIG. 1). FIG. 6 is a schematic view of an illustrative assembly for removing excess material from a closed ring component in accordance with one embodiment of the invention. Component 600 can be constructed from distinct elements 610, 620 and 630 coupled to each other to form a ring. In particular, elements 610 and 620 can be coupled using intermediate element 605, elements 620 and 630 can be coupled using intermediate element 606, and elements 630 and 610 can be coupled using intermediate element 607. Elements 610, 620 and 630 can each include a curved or angular section to allow the combined component to form a loop. Intermediate elements 605, 606 and 607 can be coupled to each of elements 610, 620 and 630 using any suitable approach including, for example, molding, braising, or other approaches described above. In particular, the material(s) used for each of intermediate elements 605, 606 and 607 can be selected to change from a first state in which it is placed between elements to a second state in which it securely connects the elements. Because of the manufacturing approach used for connecting the component elements, some portions of intermediate elements 605, 606 and 607 can extend beyond desired boundaries or interfaces, and may need to be removed. In some cases, one or more of elements 610, 620 and 630 can instead or in addition include excess material extending beyond one or more desired final surfaces of the elements.

To remove the excess material of one or more of elements 610, 620 and 630, and intermediate elements 605, 606, and 607, grinding or cutting tools 640 and 642 can be applied along inner and outer surfaces of component 600, for example as described above with respect to FIG. 5. The tools can move in any suitable direction including, for example, perpendicular to a component surface, or tangent to a component surface (e.g., following the shape of component 600). Tools 640 and 642 can be applied at any suitable time including, for example, simultaneously or sequentially (e.g., in which case only a single tool can be used). The cutting tools can remove material from one or more elements used to construct component 600 including, for example, removing material from elements 610, 620 and 630, or material from the intermediate elements, such that the resulting component has a smooth and continuous surface across the seams or interfaces between elements.

Figure 7:
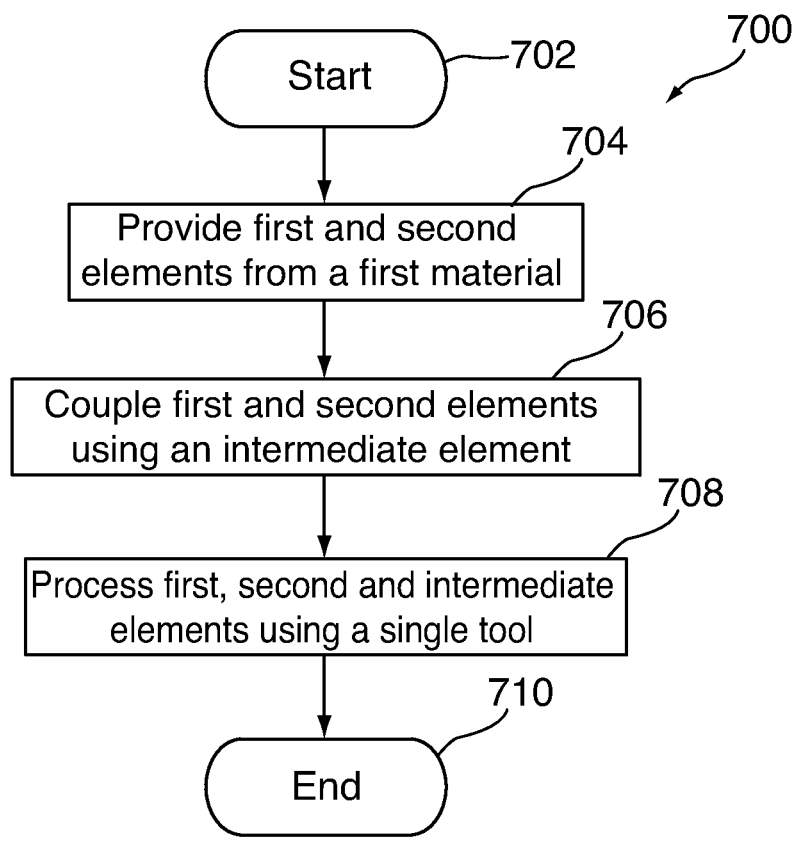
FIG. 7 is a flowchart of an illustrative process for finishing a component constructed from elements of different materials in accordance with one embodiment in the invention.

FIG. 7 is a flowchart of an illustrative process for finishing a component constructed from elements of different materials in accordance with one embodiment in the invention. Process 700 can begin at step 702. At step 704, first and second elements can be provided. The first and second elements can be constructed from the same or different materials, or from materials having the same or different properties (e.g., mechanical or manufacturing properties). For example, first and second elements can be constructed from a metal (e.g., using cold work). At step 706, the first and second elements can be connected using an intermediate element. The intermediate element can be constructed from any suitable material including, for example, a material selected such that at least two of the first, second and intermediate elements are constructed from materials having different properties. For example, the intermediate element can be constructed from plastic. The first and second elements can be connected to the intermediate element using any suitable approach including, for example, using molding or braising, as described above. In some cases, the intermediate member can be provided in a first state between the first and second elements, and subsequently change to a second state to create a structural bond between the first and second elements. At step 708, the first, second and intermediate elements can be processed using a single tool to define a uniform surface across seams or interfaces between the elements. For example, a single tool or process can be applied on a plane or surface of a component having an interface between different elements (e.g., different tools can be used for different planes or surfaces, such as front and back surfaces, but only a single tool can be used for a particular plane or surface). In some cases, the first, second and intermediate elements can be processed to create a desired final shape or surface property (e.g., a shape driven by industrial design considerations). For example, a grinding or cutting tool can be applied to the elements to process a surface of the elements and an interface between the elements. In some embodiments In some embodiments, the tool settings can be adjusted for each element based on the material used for the element, or on the properties of the material used for the element. Process 700 can end at step 710.

Figure 8:
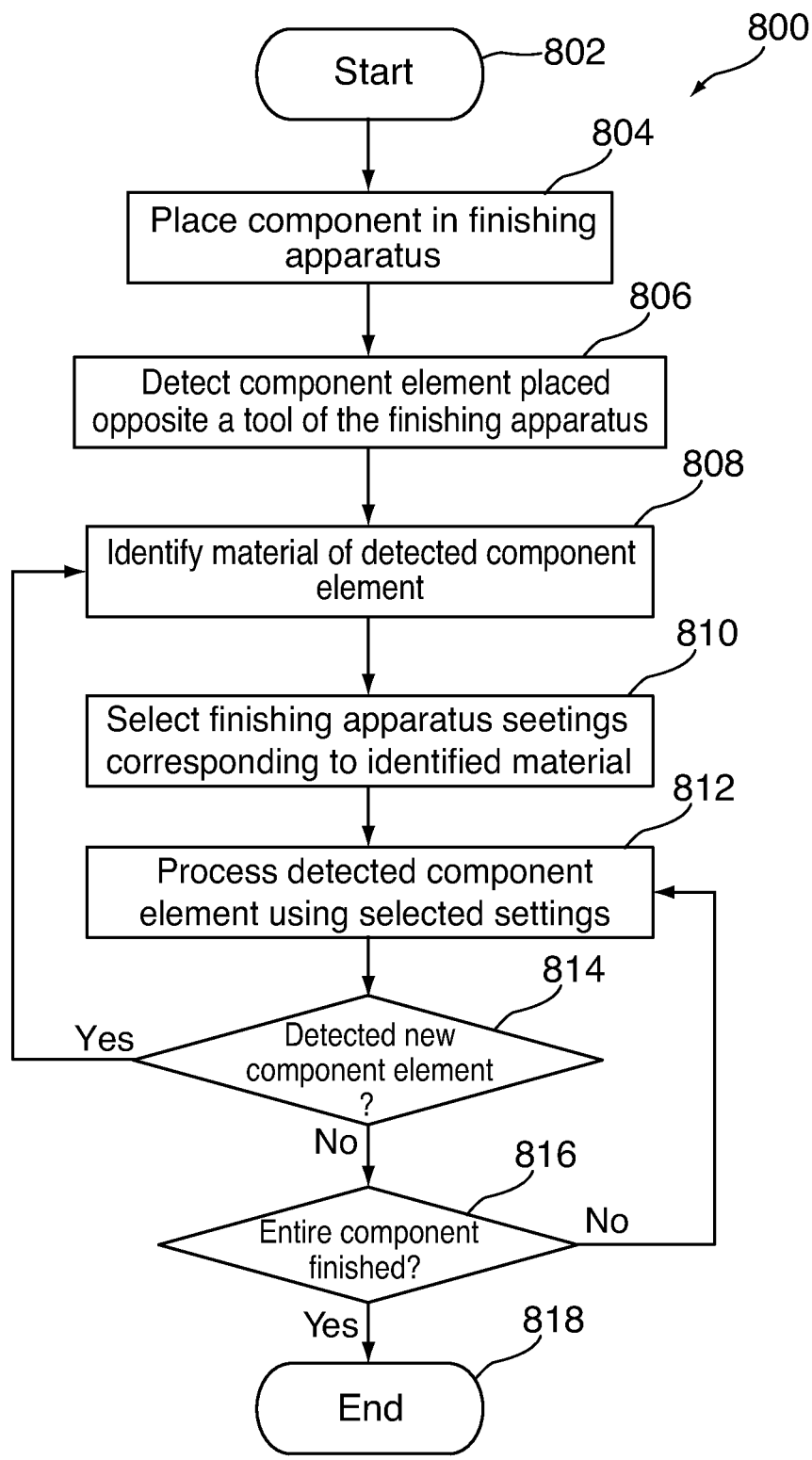
FIG. 8 is a flowchart of an illustrative process for adjusting settings of a finishing apparatus in accordance with one embodiment of the invention.

FIG. 8 is a flowchart of an illustrative process for adjusting settings of a finishing apparatus in accordance with one embodiment of the invention. Process 800 can begin at step 802. At step 804, an electronic device component constructed from several component elements connected together can be placed in a finishing apparatus. The finishing apparatus can include, for example, a machine or manufacturing process that can provide an aesthetically pleasing finish for the component, or can remove excess material from the component. The individual component elements can be connected using any suitable approach including, for example, using material properties of one of the component elements. For example, one of the component elements can change from a first state in which the component element flows between other component elements to a second state in which the component element structurally connects the other component elements to form an integral component. At step 806, the apparatus can detect a component element that is placed opposite a tool of the finishing apparatus. For example, the apparatus can detect the particular portion of the component that will be processed by the apparatus. At step 808, the apparatus can identify the material of the detected component element. For example, the apparatus can identify a material from a sensor (e.g., an optical sensor) used by the apparatus. As another example, the apparatus can determine the particular region of the component, and retrieve a material from a user provided description of the component (e.g., the region corresponds to a small component element, which is known to be an intermediate element constructed from plastic). As still another example, a user can provide information about the material directly to the finishing apparatus. In some embodiments, the apparatus can instead or in addition identify a particular material property that relates to the manner in which the tool is applied to the component (e.g., instead of or in addition to the actual material).

At step 810, the apparatus can select settings for the apparatus that correspond to the identified material. For example, the apparatus can select a particular tool, force, or other apparatus setting based on the material. In particular, the amount of force applied to the component element can vary based on the material properties (e.g., apply less force to a softer material) of the component element. In some embodiments, the apparatus can select an apparatus setting that corresponds to the softest or less resistant of the component element materials. At step 812, the apparatus can process the detected component element using the selected settings. For example, the apparatus can apply a tool to the component element with a force and at a speed determine from the apparatus settings. At step 814, the apparatus can determine whether a new component element is detected. For example, the apparatus can determine, as a tool moves, whether the tool has reached a new component element. In some cases, the apparatus can instead or in addition determine whether a new material has been detected. If the apparatus determines that a new component element has been detected, process 800 can move to step 808 and identify the material of the new component element.

If, at step 814, the apparatus instead does not detect a new component element, process 800 can move to step 816. At step 816, the apparatus can determine whether the entire component has been finished by the finishing apparatus. If the apparatus determines that the entire component has not been finished, process 800 can return to step 812 and continue to process the current component element. If, at step 816, the apparatus instead determines that the component has been entirely finished, process 800 can end at step 818.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. An electronic device component, comprising:
 a rigid structural member forming a continuous external surface of an electronic device, defining a sidewall of the electronic device, and defining an internal volume for receiving at least a portion of the electronic device, the rigid structural member comprising:
   a first element comprising an electrically conductive material and forming a first portion of the continuous exterior surface, the first element forming at least a portion of an antenna of an electrical circuit disposed within the internal volume;
   a second element comprising an electrically conductive material and forming a second portion of the continuous exterior surface; and
   an intermediate element providing an interlocking interface between the first element and the second element, the intermediate element formed from an electrically insulating material and forming a third portion of the continuous exterior surface.

2. The electronic device component of claim 1, wherein the first and second portions of the continuous external surface are smooth.

3. The electronic device component of claim 2, wherein the first and second portions of the continuous external surface define a single plane.

4. The electronic device component of claim 1, wherein the intermediate element is molded between the first and second elements.

5. The electronic device component of claim 1, wherein, the rigid structural member further comprises a third element having a U-shape.

6. The electronic device component of claim 1, wherein the intermediate element rigidly bonds the first element to the second element.

7. The electronic device component of claim 1, further comprising an adhesive between the intermediate element and the first and second elements.

8. The electronic device component of claim 1, wherein:
 the intermediate element interlocks with the first element by at least partially filling an internal feature of the first element; and
 the intermediate element interlocks with the second element by at least partially filling an internal feature of the second.

9. The electronic device component of claim 1, wherein:
 the first element comprises a protrusion extending from an interior surface of the first element; and
 the second element comprises a protrusion extending from an interior surface of the second element; wherein
 the protrusion of the first element and the protrusion of the second element each at least partially engage the intermediate element.

10. An outer periphery member of an electronic device, comprising:
 a rigid structural member defining an internal volume for enclosing an electronic circuit of the electronic device and forming a sidewall of the electronic device, the rigid structural member comprising:
   a first element defining a first exterior face of the electronic device and defining a first cavity formed within a first interior surface of the first element, the first element forming at least a portion of an antenna of the electronic circuit;
   a second element defining a second exterior face of the electronic device and defining a second cavity formed within a second interior surface of the second element; and
   an intermediate element comprising an insulating material positioned at least partially within a gap between the first element and second element and coupled to the first cavity and the second cavity thereby forming an interlocking interface between the first element and the second element.

11. The outer periphery member of claim 10, wherein the first cavity is substantially cylindrical.

12. The electronic device of claim 11, wherein the first rigid structural element comprises an antenna of an electrical circuit disposed within the interior volume.

13. The electronic device of claim 11, wherein:
 the first interior surface is defined, at least in part, by a protrusion extending from the first rigid structural element; and wherein
 the first undercut is defined at least partially within the protrusion.

14. The outer periphery member of claim 10, wherein the intermediate element is formed from plastic.

15. An electronic device component, comprising:
 a structural member forming a sidewall of the electronic device and forming at least a portion of an interior volume of the electronic device, the structural member comprising:
   a first rigid structural element defining a first undercut in a first interior surface of the first rigid structural element;
   a second rigid structural element defining a second undercut in a second interior surface of the second rigid structural element;

an intermediate element positioned in a gap between the first rigid structural element and the second rigid structural element and forming at least a portion of a continuous exterior surface of the electronic device; wherein the intermediate element is engaged with the first and second undercuts.

\* \* \* \* \*